(12) United States Patent
Oh et al.

(10) Patent No.: US 9,761,602 B2
(45) Date of Patent: Sep. 12, 2017

(54) SEMICONDUCTOR MEMORY DEVICE

(71) Applicant: SK hynix Inc., Gyeonggi-do (KR)

(72) Inventors: Sung Lae Oh, Chungcheongbuk-do (KR); Dae Sung Eom, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/819,222

(22) Filed: Aug. 5, 2015

(65) Prior Publication Data

US 2016/0260698 A1 Sep. 8, 2016

(30) Foreign Application Priority Data

Mar. 6, 2015 (KR) .................. 10-2015-0031872

(51) Int. Cl.
| | |
|---|---|
| *H01L 27/07* | (2006.01) |
| *H01L 27/11573* | (2017.01) |
| *H01L 27/11526* | (2017.01) |
| H01L 27/11548 | (2017.01) |
| H01L 27/11556 | (2017.01) |
| H01L 27/11575 | (2017.01) |
| H01L 27/11582 | (2017.01) |

(52) U.S. Cl.
CPC .. *H01L 27/11573* (2013.01); *H01L 27/11526* (2013.01); *H01L 27/11548* (2013.01); *H01L 27/11556* (2013.01); *H01L 27/11575* (2013.01); *H01L 27/11582* (2013.01)

(58) Field of Classification Search
CPC ..... G11C 16/0483; G11C 16/08; G11C 16/10; G11C 16/3427; G11C 7/04; G11C 16/04; G11C 16/06; G11C 16/12; G11C 16/14; G11C 16/16; G11C 16/24; G11C 16/26; G11C 16/3418; G11C 16/3454; G11C 16/3459

See application file for complete search history.

(56) References Cited

U.S. PATENT DOCUMENTS

| | | | | |
|---|---|---|---|---|
| 6,653,861 | B1 * | 11/2003 | Agrawal | H03K 19/1737 326/39 |
| 8,947,934 | B2 * | 2/2015 | Yip | G11C 16/0483 365/185.11 |
| 9,208,886 | B2 * | 12/2015 | Nam | G11C 16/10 |
| 2004/0225980 | A1 * | 11/2004 | Cappelli | H01L 27/11803 716/117 |
| 2009/0097316 | A1 * | 4/2009 | Lee | G11C 16/0483 365/185.13 |
| 2010/0090286 | A1 * | 4/2010 | Lee | H01L 27/11526 257/368 |
| 2011/0180866 | A1 * | 7/2011 | Matsuda | H01L 27/11573 257/324 |

(Continued)

FOREIGN PATENT DOCUMENTS

| | | |
|---|---|---|
| KR | 1020100039919 | 4/2010 |
| KR | 1020140093038 | 7/2014 |

*Primary Examiner* — Edward Chin
(74) *Attorney, Agent, or Firm* — IP & T Group LLP

(57) ABSTRACT

A semiconductor memory device to which a Peri Under Cell (PUC) structure is applied is disclosed. The semiconductor memory device includes a word line multilayered structure formed in a cell region, and extending from across the cell region; and a slimming region including a step-shaped pad structure in the word line multilayered structure.

17 Claims, 10 Drawing Sheets

(56) References Cited

U.S. PATENT DOCUMENTS

| | | | |
|---|---|---|---|
| 2011/0199833 A1* | 8/2011 | Shim | G11C 16/0483 365/185.23 |
| 2012/0120725 A1* | 5/2012 | Ahn | G11C 16/0483 365/185.02 |
| 2012/0257455 A1* | 10/2012 | Oh | G11C 16/10 365/185.22 |
| 2013/0126957 A1* | 5/2013 | Higashitani | H01L 27/11519 257/314 |
| 2014/0197516 A1* | 7/2014 | Lue | H01L 22/12 257/506 |
| 2014/0197546 A1* | 7/2014 | Hwang | H01L 27/11524 257/774 |
| 2016/0055912 A1* | 2/2016 | Lee | G11C 16/08 365/185.05 |

* cited by examiner

SEMICONDUCTOR MEMORY DEVICE

CROSS-REFERENCE TO RELATED APPLICATION

This application claims priority of Korean patent application No. 10-2015-0031872, filed on 6 Mar. 2015, the disclosure of which is hereby incorporated by reference in its entirety.

BACKGROUND

1. Field

Embodiments of the present disclosure relate to a semiconductor memory device and, more particularly, to a technology for increasing area availability of a memory device in a Peripheral Under Cell (PUC) structure.

2. Description of the Related Art

With advancements in semiconductor technology, the demand for highly-integrated memory devices continues to increase. The conventional method for increasing integration has been to reduce the amount of area each memory cell occupies on the substrate.

However, the conventional method has reached a limit in its physical ability to reduce memory cell size. In order to address this issue, methods for fabricating memory devices having three-dimensionally arranged memory cells have recently been proposed. If the memory cells are arranged in three dimensions, the semiconductor substrate area can be used more efficiently.

SUMMARY

Various embodiments of the present disclosure are directed to a semiconductor memory device in which a slimming region including a step-shaped pad structure is disposed in a cell region, thereby minimizing chip size.

In accordance with an aspect of the present disclosure, a semiconductor memory device comprising: a word line multilayered structure formed in a cell region, and extending across the cell region; and a slimming region including a step-shaped pad structure in the word line multilayered structure.

The word line multilayered structure includes alternately stacked conductive materials and insulation films.

A first contact coupled to the step-shaped pad structure of the slimming region.

A peripheral region below the cell region.

An active region in the peripheral region; a gate electrode perpendicular to the active region; and a junction region in the active region at both sides of the gate electrode.

A bit line contact plug passing through the word line multilayered structure; and a plurality of bit lines coupled to the bit line contact plug, and perpendicular to the word line multilayered structure.

In accordance with another aspect of the present disclosure, a first word line multilayered structure in a cell region, and extending across the cell region; a first slimming region in the first word line multilayered structure; a second word line multilayered structure in the cell region, and extending across the cell region; and a second slimming region formed in the second word line multilayered structure.

The word line multilayered structure includes alternately stacked conductive materials and insulation films.

Each of the first and second sliming regions includes: a step-shaped pad structure in the word line multilayered structure.

The step-shaped pad structure includes: a first surface that decreases in height going toward where the word line multilayered structure extends; and a second surface on that increases in height toward where the word line multilayered structure extends.

The first surface and the second surface of the step-shaped pad structure are symmetrical or asymmetrical to each other.

The first word line multilayered structure and the second word line multilayered structure are spaced apart from each other by a slit.

A first contact formed in the step-shaped pad structure of the first slimming region and the second slimming region; a second contact formed in the slit; and a metal line coupled to the first contact and the second contact.

A bit line contact plug formed to pass through the first word line multilayered structure and the second word line multilayered structure; and a plurality of bit lines coupled to the bit line contact plug, and perpendicular to the first word line multilayered structure and the second word line multilayered structure.

A peripheral region arranged below the cell region.

An active region arranged in the peripheral region; a gate electrode perpendicular to the active region; and a junction region formed in the active region at both sides of the gate electrode.

A metal line coupled to the junction region, wherein the metal line is coupled to the second contact.

In accordance with another aspect of the present disclosure, a semiconductor memory device includes: a semiconductor memory device comprising: a cell region in which a word line multilayered structure is formed; a peripheral region arranged below the cell region; and a slimming region arranged in the cell region, suitable for coupling the cell region to the peripheral region, and including a pad structure formed by etching the word line multilayered structure of the cell region.

An active region arranged in the peripheral region; a gate electrode perpendicular to the active region; a junction region formed in the active region at both sides of the gate electrode; a bit line contact plug formed to pass through the word line multilayered structure; and a plurality of bit lines coupled to the bit line contact plug, and perpendicular to the word line multilayered structure.

The pad structure includes a step shape having a first surface that reduces in height in a direction in which the word line multilayered structure extends, and a second surface that increases in height in the direction in which the word line multilayered structure extends.

It is to be understood that both the foregoing general description and the following detailed description are exemplary and explanatory and are intended to explain the claims.

DESCRIPTION OF EMBODIMENTS

Reference will now be made in detail to embodiments, examples of which are illustrated in the accompanying drawings. Wherever possible, the same reference numbers will be used to refer to the same parts. In the following description, a detailed description of well known configurations or functions will be omitted when it may make the subject matter less clear.

Figure 1:
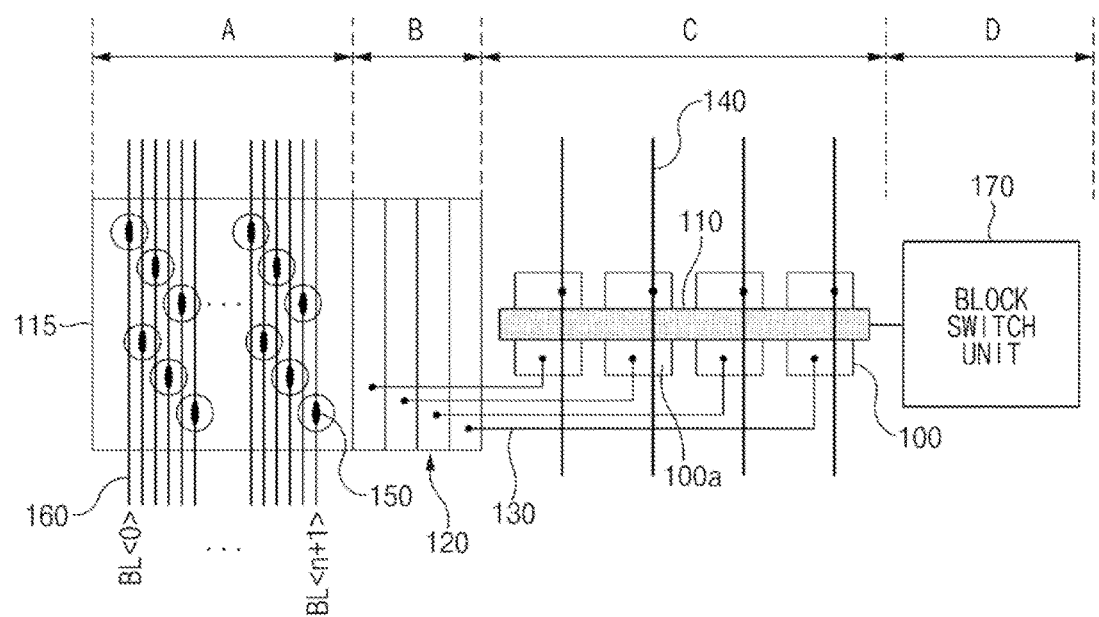
FIGS. 1 and 2 are schematic diagrams illustrating a conventional three-dimensional (3D) semiconductor memory device.
Figure 2:
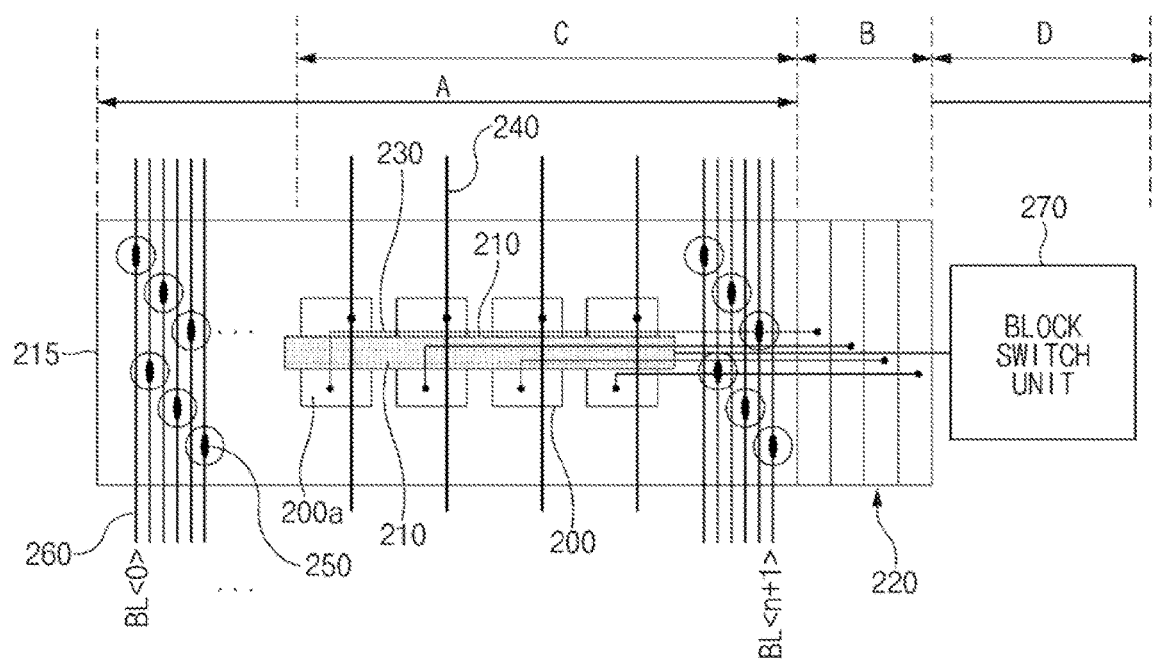

FIGS. 1 and 2 are schematic diagrams illustrating a conventional three-dimensional (3D) semiconductor memory device.

Referring to FIG. 1, the conventional 3D semiconductor memory device includes a cell region A and an X-decoder region spaced apart from the cell region A by a predetermined distance.

The cell region A includes a word line multilayered structure 115 formed by alternately stacking a conductive material and an insulation film, and a plurality of bit lines 160 extending perpendicular to the word line multilayered structure 115. The bit lines 160 are coupled to a semiconductor substrate (not shown) through bit line contact plugs 150 formed to pass through the word line multilayered structure 115.

The X-decoder region includes a pass transistor region C and a block switch region D. A plurality of active regions 100, a gate electrode 110, and a source/drain junction region 100a are included in the pass transistor region C. A block switch unit 170 coupled to the gate electrode 110 is disposed in the block switch region D.

As described above, the conventional 3D semiconductor memory device includes the cell region A and the X-decoder region spaced apart from the cell region A. A slimming region B for coupling the cell region A to the pass transistor region C is arranged between the cell region A and the X-decoder region. The slimming region B includes a step-shaped pad structure 120 formed by etching the word line multilayered structure 115 formed in the slimming region B at an outer wall of the cell region A and a first metal line 130 and a second metal line 140 respectively coupled to the pad structure 120 and the source/drain junction region 100a of the pass transistor region C. The second metal line 140 may be formed higher than the bit lines 160 of the cell region A.

FIG. 2 shows a Peripheral Under Cell (PUC) structure in which a peripheral (Peri) region having a pass transistor region is arranged below a cell region to increase the available area of the 3D semiconductor memory device shown in FIG. 1.

Referring to FIG. 2, the 3D semiconductor memory device includes the cell region A; and the pass transistor region C located below a part of the cell region A. The 3D semiconductor memory device further includes a block switch region D spaced apart from the cell region A by a predetermined distance.

A plurality of active regions 200, a gate electrode 210, and a source/drain junction region 200a are included in the pass transistor region C. A block switch unit 270 coupled to the gate electrode 110 is included in the block switch region D.

The cell region A may include a word line multilayered structure 215 formed by alternately stacking a conductive material and an insulation film; and a plurality of bit lines 260 extending perpendicular to the word line multilayered structure 215. The bit lines 260 are coupled to a semiconductor substrate (not shown) through bit line contact plugs 250 formed to pass through the word line multilayered structure 215.

In addition, a slimming region B for coupling the cell region A to the pass transistor region C is arranged at an outer wall of the cell region A. The slimming region B includes a step-shaped pad structure 220 formed by etching the word line multilayered structure 215 formed in the slimming region B at the outer wall of the cell region A; and a first metal line 230 and a second metal line 240 respectively coupled to the pad structure 220 and a source/drain junction region 200a of the pass transistor region C. The second metal line 240 is formed in the pass transistor region C located below the cell region A, extends parallel to the bit lines 260, and is lower than the bit lines 260 of the cell region A.

As described above, even when the pass transistor region C is arranged below the cell region A to increase the available area of the 3D semiconductor memory device, the slimming region B for coupling the cell region A to the pass transistor region C has to be arranged at the outer wall of the cell region A, resulting in a reduction of the available area.

In order to address the above-mentioned issue in which the area availability is reduced by arranging the slimming region at the outer wall of the cell region, the semiconductor memory device according to the embodiment proposes an improved structure in which a slimming region is arranged in the cell region.

Figure 3:
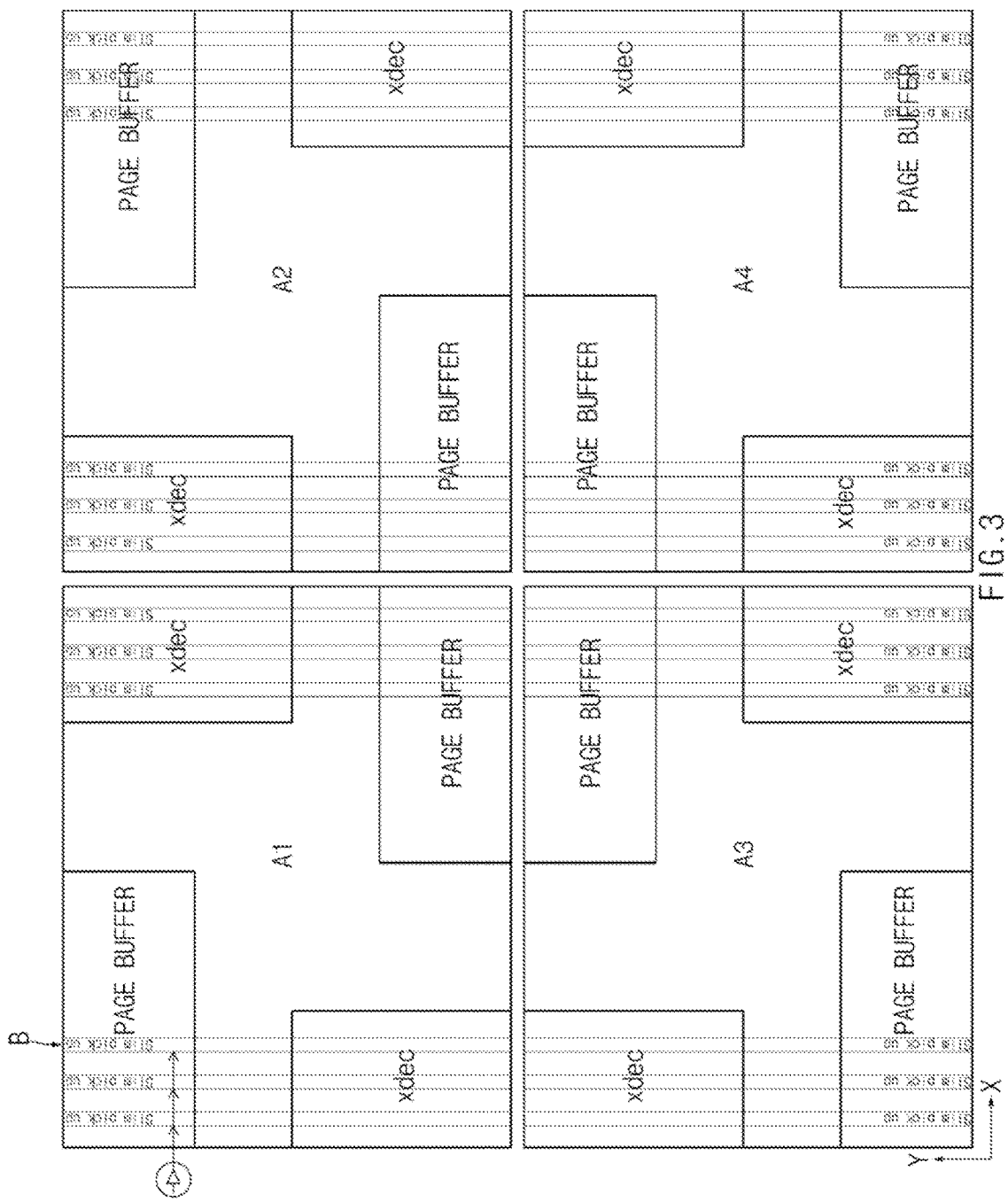
FIG. 3 is a schematic diagram illustrating cell regions of a 3D semiconductor memory device.

FIG. 3 is a schematic diagram illustrating cell regions of a 3D semiconductor memory device.

Referring to FIG. 3, a page buffer region and an X-decoder region are arranged in each of the cell regions A1 to A4 of the 3D semiconductor memory device. The plurality of cell regions A1 to A4, each of which includes the page buffer region and the X-decoder region, may be adjacent on an X-axis and a Y-axis.

As can be seen from FIG. 3, the cell regions A1 to A4 may be arranged in a (2×2) shape. In another embodiment, the cell regions may be arranged in a (1×4) shape.

The (2×2)-shaped cell regions will hereinafter be described with reference to FIG. 3.

The cell regions A1 to A4 include a first cell region A1, a second cell region A2, a third cell region A3, and a fourth cell region A4. The first cell region A1 and the second cell region A2 are adjacent to each other on the X-axis, the third cell region A3 and the fourth cell region A4 are adjacent to each other on the X-axis, and the first cell region A1 and the third cell region A3 are adjacent to each other on the Y-axis. The individual adjacent cell regions are separated from each other by a predetermined space, and word lines and bit lines (not shown) are short-circuited in the predetermined space.

The X-decoder region and the page buffer region of the first cell region A1 are adjacent to the X-decoder region and the page buffer region of the second cell region A2, respectively. In addition, the X-decoder region and the page buffer region of the first cell region A1 are adjacent to the X-decoder region and the page buffer region of the third cell region A3, respectively. That is, each of the cell regions A1 to A4 may be arranged to be symmetrical to the adjacent cell regions on the X-axis and Y-axis.

The X-decoder region may include a decoder for selecting a word line corresponding to a predetermined cell in response to word-line and bit-line selection signals so that a read or write operation is performed on the selected cell. The X-decoder region includes a block switch region (D of FIG. 2) and a pass transistor region (C of FIG. 2). Conventionally, as can be seen from FIG. 1, the cell region and the X-decoder region are separated from each other, and the slimming region for coupling the cell region to the pass transistor region is arranged at the outer wall of the cell region.

However, referring to FIG. 3, a slimming region B is arranged in each of the cell regions A1 to A4, so that the cell region may be minimized in size.

Although not shown in the drawings, the word lines may extend to the X-axis and the bit lines may extend to the Y-axis. The word lines and the bit lines may be electrically coupled to memory cells and arranged in the cell regions A1 to A4.

In addition, a plurality of slimming regions B may be separately arranged to distribute metal lines of the X-decoder region. The slimming regions B may be spaced apart from each other by a predetermined distance in a direction parallel to the bit line, and a step-shaped pad structure may be formed by etching the word line multilayered structure.

A circuit to drive a page buffer may be inserted into the slimming regions arranged not only in the X-decoder region but also in the page buffer region.

Figure 4:
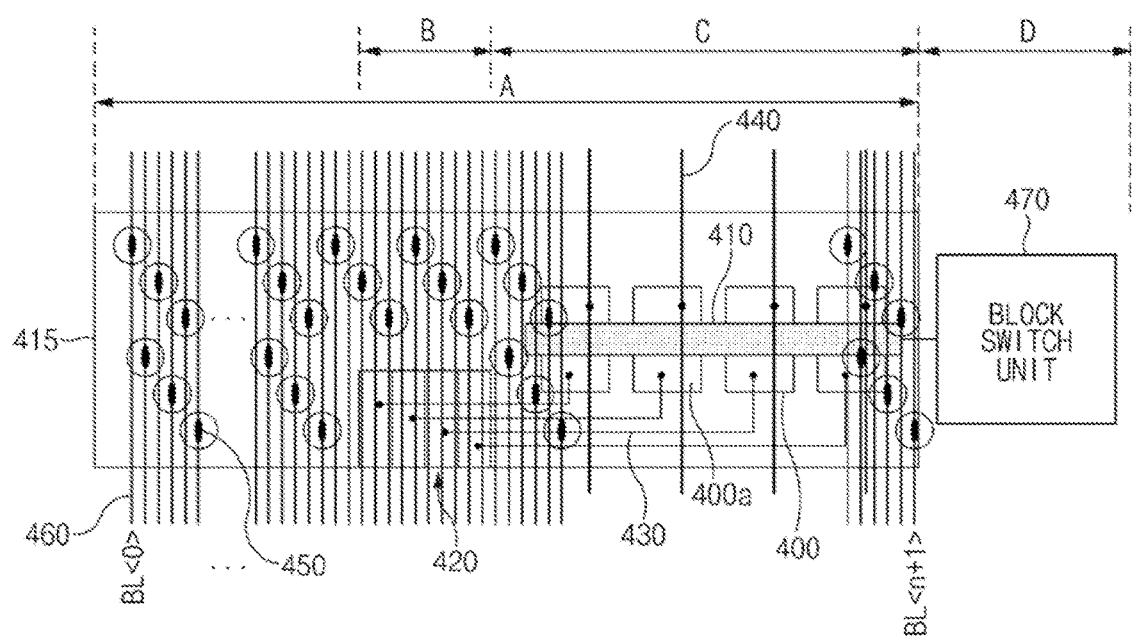
FIGS. 4 and 5 are schematic diagrams illustrating a semiconductor memory device according to an embodiment of the present disclosure.
Figure 5:
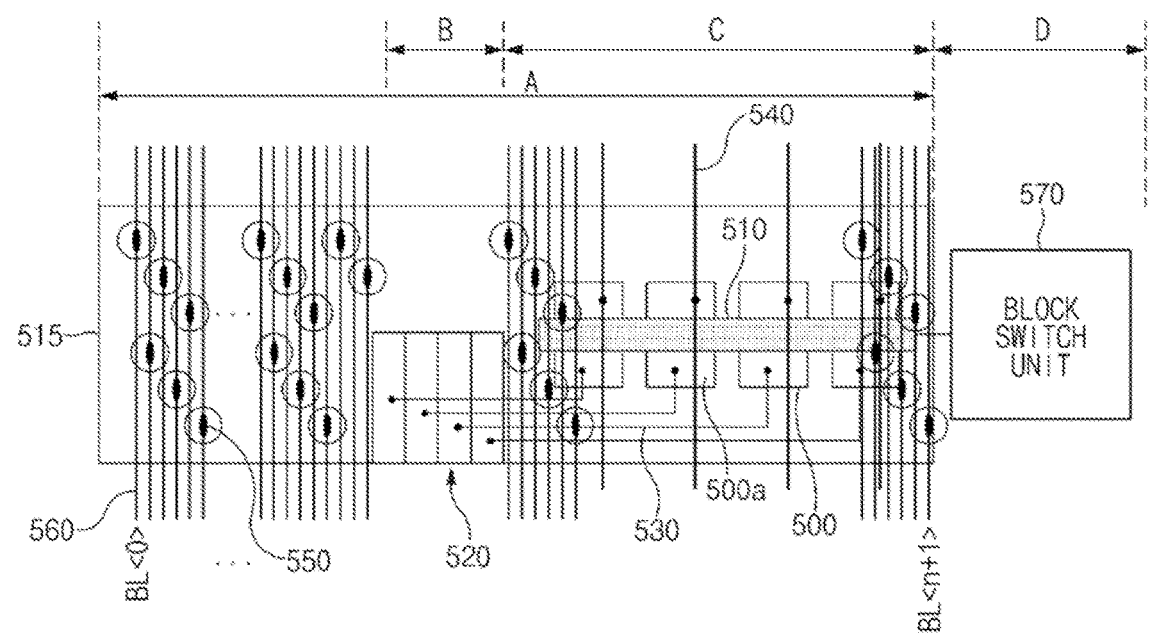

FIGS. 4 and 5 are schematic diagrams illustrating a semiconductor memory device according to embodiments of the present disclosure. FIGS. 4 and 5 are plan views illustrating some parts of the cell regions shown in FIG. 3.

A 3D semiconductor memory device according to an embodiment will hereinafter be described with reference to FIG. 4.

Referring to FIG. 4, a slimming region B and a pass transistor region C are arranged in a cell region A of the 3D semiconductor memory device, and a block switch region D is arranged at an outer wall of the cell region A.

The pass transistor region C may be arranged below the cell region A, and a plurality of active regions 400 may be arranged in the pass transistor region C. In addition, the pass transistor region C may include a line-shaped gate electrode 410 perpendicular to the active region 400, and a source/drain junction region 400a formed in the active region 400 at both sides of the gate electrode 410.

A block switch unit 470 coupled to the line-shaped gate electrode 410 may be disposed in the block switch region D.

A plurality of word line multilayered structures 415 may be arranged in the cell region A. The word line multilayered structures 415 are formed by alternately stacking a multi-layered conductive material and insulation films.

In addition, a plurality of bit lines 460 may be formed to cross the word line multilayered structures 415. The bit lines 460 may be coupled to a semiconductor substrate (not shown) through bit line contact plugs 450 passing through the word line multilayered structures 415.

The slimming region B may be patterned in a manner that contact plugs are coupled to the stacked word line multilayered structures 415. The slimming region B may include a step-shaped pad structure 420 formed by etching the word line multilayered structures 415 of the cell region A. In this case, the bit line contact plugs 450 coupled to the bit lines 460 are not arranged in a region in which the pad structure 420 is formed.

The pad structure 420 of the slimming region B is coupled to the source/drain junction region 400a of the pass transistor region C located below the cell region A through a first metal line 430.

A second metal line 440 coupled to the source/drain junction region 400a of the pass transistor region C is provided. The second metal line 440 is formed in the pass transistor region C located below the cell region A, extends parallel to the bit line 260, and is lower than the bit line 260.

A 3D semiconductor memory device according to another embodiment will hereinafter be described with reference to FIG. 5.

Referring to FIG. 5, a slimming region B and a pass transistor region C are arranged in a cell region A. The pass transistor region C is arranged below the cell region A, and a plurality of active regions 500 may be arranged in the pass transistor region C. In addition, the pass transistor region C may include a line-shaped gate electrode 510 crossing the active region 500, and a source/drain junction region 500a formed in the active region 500 at both sides of the gate electrode 510.

A block switch region D is arranged at an outer wall of the cell region A, and a block switching unit 570 coupled to the line-shaped gate electrode 510 may be disposed in the block switch region D.

The cell region A may include a plurality of word line multilayered structures 515. The word line multilayered structures 515 may be formed by alternately stacking multi-layered conductive materials and Insulation films.

In addition, a plurality of bit lines 560 may be arranged perpendicular to the word line multilayered structures 515. The bit lines 560 may be coupled to a semiconductor substrate (not shown) through bit line contact plugs 550 passing through the word line multilayered structures 515.

The slimming region B may be patterned in a manner such that contact plugs are respectively coupled to the stacked word line multilayered structures 515, and may include a step-shaped pad structure 520 formed by etching the word line multilayered structures 515 of the cell region A. In this case, a space in which the bit lines 560 are not formed is separately formed, and the pad structure 520 is arranged in the space. In addition, the bit line contact plugs 550 coupled to the bit lines 560 are not arranged in a region in which the pad structure 520 is formed.

The slimming region B is a dummy space unnecessary for a page buffer region, so that a circuit to drive a page buffer may also be inserted into the slimming region B of the page buffer region as necessary.

The pad structure 520 of the slimming region B may be coupled to the source/drain junction region 500a of the pass transistor region C located below the cell region A through a first metal line 530.

A second metal line 540 coupled to the source/drain junction region 500a of the pass transistor region C is provided. The second metal line 540 is formed in the pass transistor region C located below the cell region A, extends parallel to the bit line 560, and is lower than the bit line 560.

As described above, the slimming region B according to the embodiment is arranged in the cell region A, as compared to the conventional slimming region B arranged at the outer wall of the cell region A. As a result, the available area of a memory device may be increased.

Figure 6A:
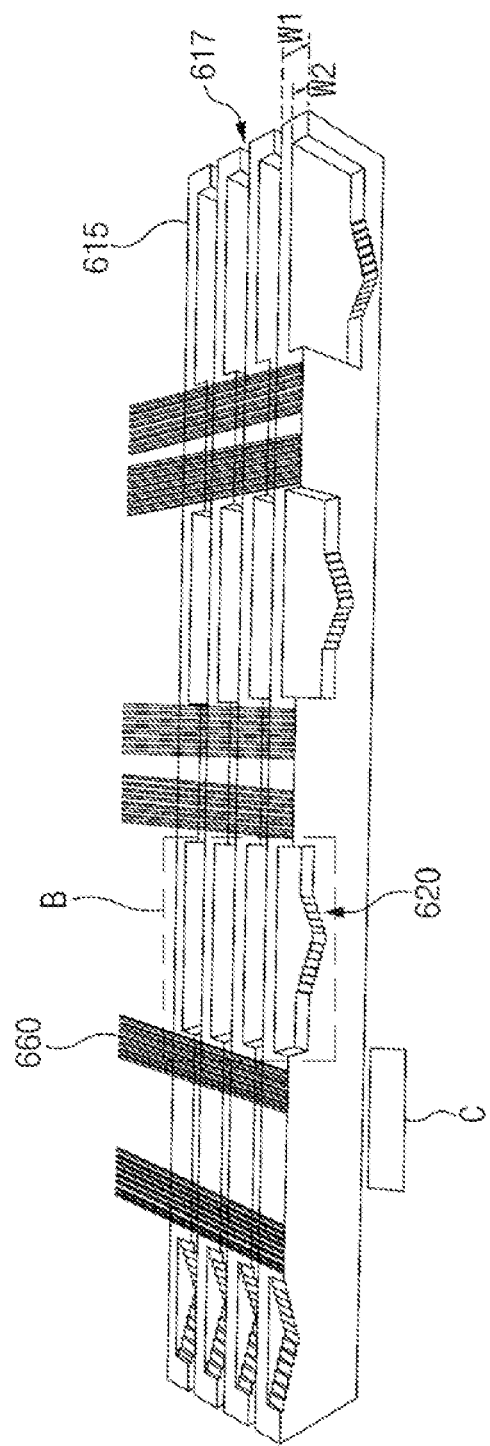
FIGS. 6A and 6B are a stereoscopic view and a plan view illustrating a semiconductor memory device according to an embodiment of the present disclosure.
Figure 6B:
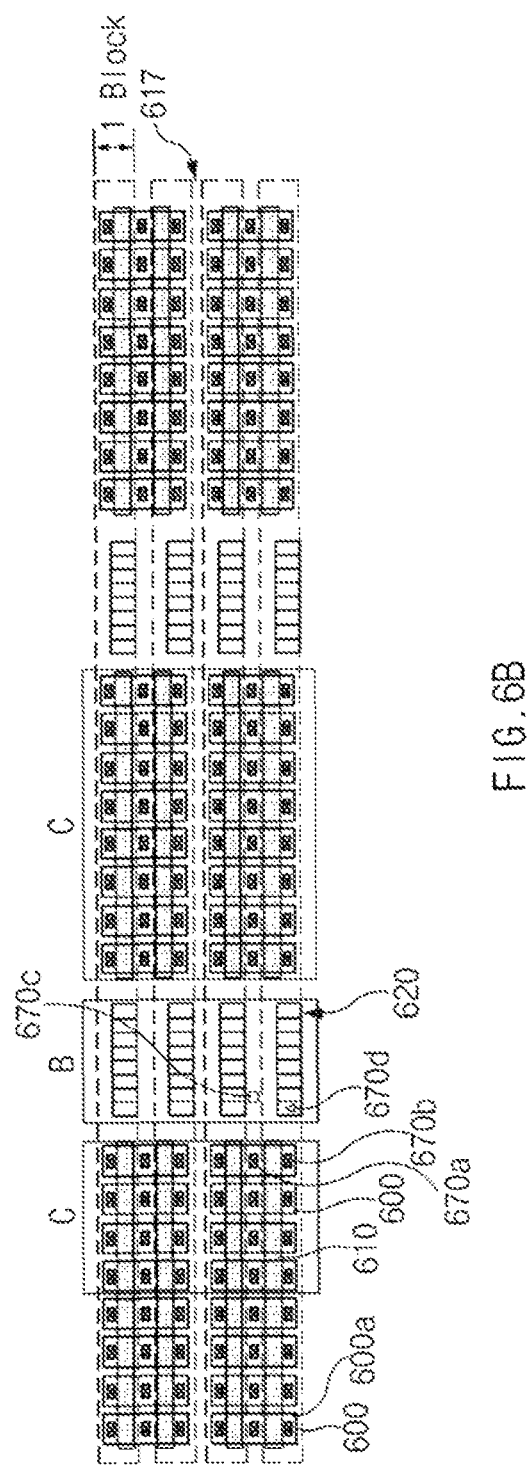

FIGS. 6A and 6B are a stereoscopic view and a plan view illustrating a semiconductor memory device according to an embodiment of the present disclosure.

FIG. 6A is a stereoscopic view illustrating a cell region of the semiconductor memory device according to an embodiment.

Referring to FIG. 6A, a plurality of word line multilayered structures 615 and a plurality of bit lines 660 are disposed in the cell region A. The word line multilayered structures 615 extend across the cell region A. Each word line multilayered structure 615 is formed of a multi-layered structure in which conductive materials and insulation films are alternately stacked.

The cell region A may include a plurality of slimming regions B formed by etching the word line multilayered structures 615. The word line multilayered structures 615 of the slimming region B may be patterned in a step shape. For example, a mask pattern (not shown) is formed to cover the slimming region B, and a process of reducing the size of the mask pattern (not shown) while simultaneously etching the conductive materials and the insulation films is repeatedly performed. As a result, a step-shaped pad structure 620 may be formed.

In this case, the pad structure 620 may be etched to have a critical dimension W2 smaller than a critical dimension W1 of the word lines multilayered structures 615 included in one block. In other words, by forming the pad structure 620, the word line multilayered structure 615 connects.

The horizontally symmetrical pad structure 620 may be formed in one slimming region B. Although the embodiment has exemplarily disclosed a horizontally symmetrical pad structure, the scope of the present disclosure is not limited thereto, and a horizontally asymmetrical pad structure may also be formed in one slimming region. In addition, slimming region B and the other slimming region B adjacent thereto may have different heights of upper ends and lower ends.

The cell region A may include a plurality of word line multilayered structures 615. The word line multilayered structures 615 may be separated in units of memory blocks. That is, the word line multilayered structures 615 included in one memory block are interconnected, and the word line multilayered structures 615 included in different memory blocks may be isolated from each other by slits 617.

In addition, the plurality of bit lines 660 may be arranged perpendicular to the word line multilayered structures 615. In this case, the bit lines 660 may be arranged over the slimming region B as shown in FIG. 4, and may also be arranged only on the remaining regions, as shown in FIG. 5.

FIG. 6B is a plan view illustrating the slimming region B and the pass transistor region C shown in FIG. 6A. Referring to FIG. 6B, the pass transistor region C is disposed in a peripheral (Peri) region, and is arranged below the cell region. The slimming region B includes a pad structure, and is disposed in the cell region.

A plurality of active regions 600 may be arranged parallel to each other in the pass transistor region C, and gate electrodes 610 crossing the active regions 600 may be arranged in the pass transistor region C. Source/drain junction regions 600a may be formed in the active regions 600 at both sides of each gate electrode 610, and a first contact 670a and a second contact 670b are arranged in each source/drain junction region 600a.

A third contact 670c may be arranged in each slit 617 disposed between blocks.

The slimming region B may include a plurality of step-patterned pad structures 620 having a step difference. Each pad structure 620 may include a first surface on which a word-line height is reduced in a direction in which the word line multilayered structures 615 extend; and a second surface on which a word-line height is increased in the direction in which the word line multilayered structures 615 extend. For convenience, only the first surface of each pad structure 620 is depicted in the plan view of FIG. 6B. A fourth contact 670d is arranged in the pad structure 620 of the slimming region B. Although one contact is arranged in each word line multilayered structure 615 of the pad structure 620, the scope of the invention is not limited thereto, and contacts may be alternately arranged over the first surface and second surface of each pad structure 620 as necessary.

As described in above embodiment, the slimming region B is arranged in the cell region A, as compared to a conventional slimming region B that is located at the outer wall of the cell region A. As a result, the available area of a memory device may be increased.

Figure 7A:
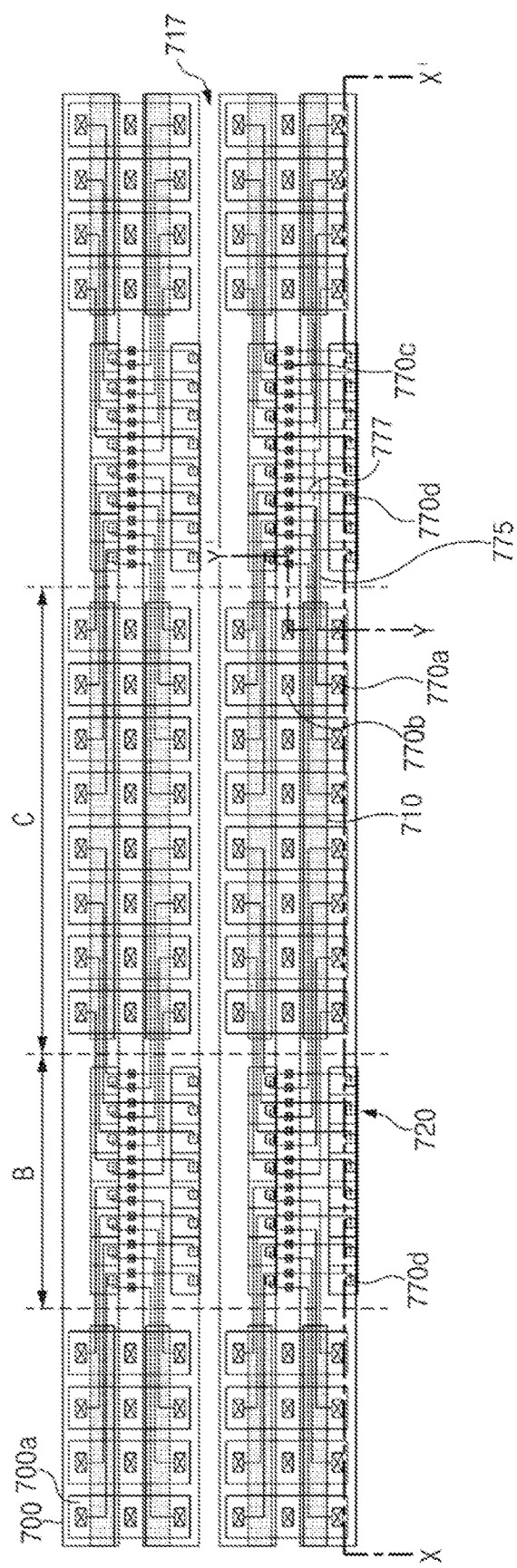
FIGS. 7A to 7C are a plan view and a cross-sectional view illustrating a semiconductor memory device according to an embodiment of the present disclosure.
Figure 7B:
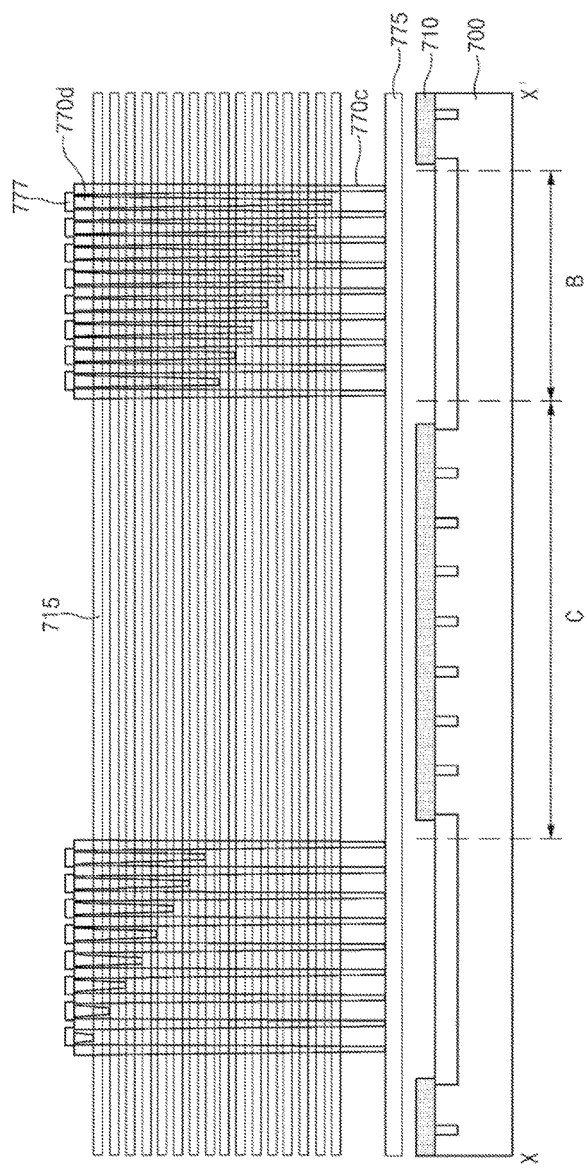
Figure 7C:
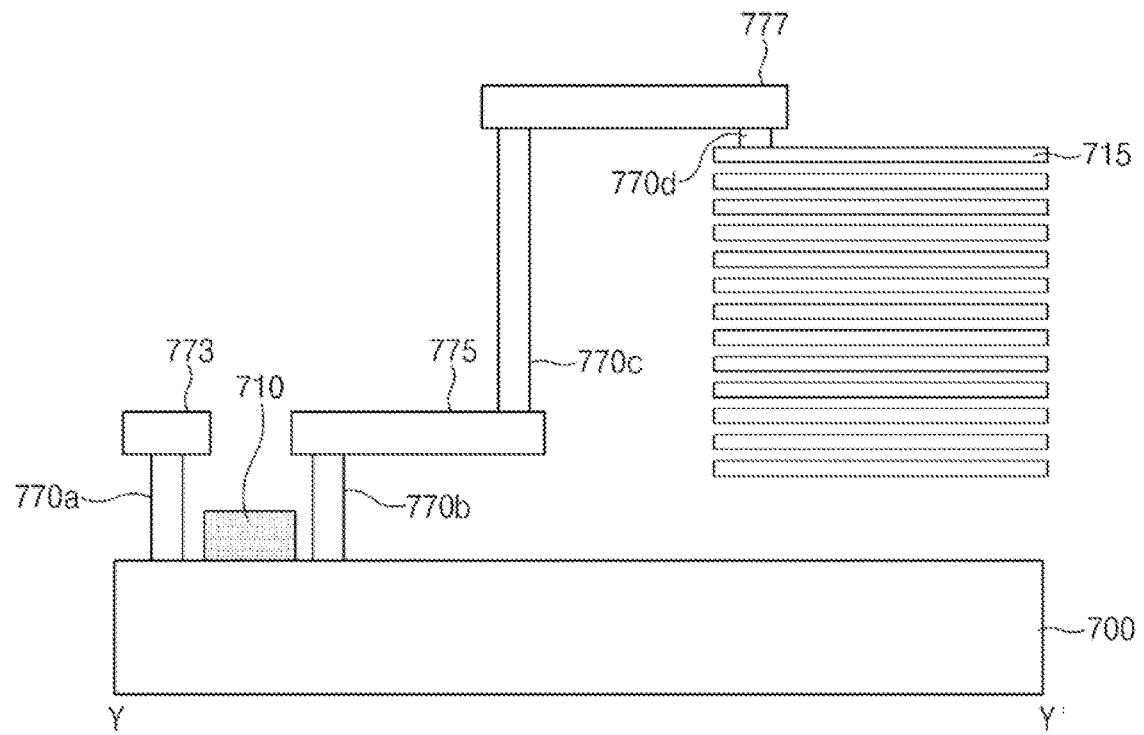

FIGS. 7A to 7C are a plan view and a cross-sectional view illustrating a semiconductor memory device according to an embodiment of the present disclosure.

FIG. 7A illustrates an arrangement of metal lines for coupling the cell region to the pass transistor region shown in FIG. 6B. FIG. 7B is a cross-sectional view illustrating the semiconductor memory device taken along the line X-X' of FIG. 7A, and FIG. 7C is a cross-sectional view illustrating the line Y-Y' of FIG. 7A.

The connection relationship among the pass transistor region C, the gate electrode 710, and the slimming region B will hereinafter be described with reference to FIGS. 7A to 7C.

A plurality of active regions 700 may be arranged parallel to each other in the pass transistor region C, and gate electrodes 710 crossing the active regions 700 may be arranged in the pass transistor region C. Source/drain junction regions 700a may be formed in the active regions 700 at both sides of each gate electrode 710, and a first contact 770a and a second contact 770b are arranged in each source/drain junction region 700a.

A fourth contact 770d coupled to a word line multilayered structure 715 is arranged over the pad structure 720 of the slimming region B. A third contact 770c is arranged at a slit 717 formed to isolate the word line multilayered structure 715 in units of memory blocks.

A first metal line 775 is coupled to the first contact 770a, and a second metal line 773 is coupled to the second contact 770b.

A first terminal of the third contact 770c is coupled to the first metal line 775, and a second terminal of the third contact 770c is coupled to the third metal line 777.

In addition, a first terminal of the fourth contact 770d is coupled to the third metal line 777, and a second terminal of the fourth contact 770d is coupled to the word line multilayered structure 715 of the pad structure 720.

As is apparent from the above description, a slimming region having a pad structure is arranged in a cell region, so that a Peripheral Under Cell (PUC) structure may be implemented without increasing the number of strings. Since the number of strings are not increased, block size increase is suppressed, so that an efficient block size may be proposed.

In addition, a contact passing through a slit between memory blocks is formed so that a pad structure of a slimming region is coupled to a pass transistor region located below a cell region. As a result, a region is not added due to the slimming region formed in the cell region, so that chip size increase may be suppressed.

Those skilled in the art will appreciate that embodiments of the present disclosure may be carried out in other ways than those set forth herein without departing from the scope of the present invention. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor are embodiments limited to any specific type of semiconductor memory devices. For example, embodiments may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor memory device comprising:
   a word line multilayered structure formed in a cell region, and extending across the cell region;
   a slimming region including a step-shaped pad structure in the word line multilayered structure; and
   a plurality of bit lines formed over the word line multilayered structure and perpendicular to the word line multilayered structure,
   wherein the slimming region is disposed between the bit lines in the cell region.

2. The semiconductor memory device according to claim 1, wherein the word line multilayered structure includes alternately stacked conductive materials and insulation films.

3. The semiconductor memory device according to claim 1, further comprising:
   a first contact coupled to the step-shaped pad structure of the slimming region.

4. The semiconductor memory device according to claim 1, further comprising:
   a peripheral region below the cell region.

5. The semiconductor memory device according to claim 4, further comprising:
   an active region in the peripheral region;
   a gate electrode perpendicular to the active region; and
   a junction region in the active region at both sides of the gate electrode.

6. The semiconductor memory device according to claim 1, further comprising:
   a bit line contact plug passing through the word line multilayered structure and coupled to the bit line.

7. A semiconductor memory device comprising:
   a first word line multilayered structure in a cell region, and extending across the cell region;
   a first slimming region in the first word line multilayered structure;
   a second word line multilayered structure in the cell region, and extending across the cell region;
   a second slimming region formed in the second word line multilayered structure; and
   a plurality of bit lines formed over the first and second word line multilayered structures and perpendicular to the first and second word line multilayered structure,
   wherein each of the first and second sliming regions includes a step-shaped pad structure,
   wherein the first slimming region and the second sliming regions are disposed between the bit lines in the cell region.

8. The semiconductor memory device according to claim 7, wherein the word line multilayered structure includes alternately stacked conductive materials and insulation films.

9. The semiconductor memory device according to claim 7, wherein the first surface and the second surface of the step-shaped pad structure are symmetrical to each other.

10. The semiconductor memory device according to claim 7, wherein the first word line multilayered structure and the second word line multilayered structure are spaced apart from each other by a slit.

11. The semiconductor memory device according to claim 10, further comprising:
    a first contact formed in the step-shaped pad structure of the first slimming region and the second slimming region;
    a second contact formed in the slit; and
    a metal line coupled to the first contact and the second contact.

12. The semiconductor memory device according to claim 7, further comprising:
    a bit line contact plug formed to pass through the first word line multilayered structure and the second word line multilayered structure; and
    a plurality of bit lines coupled to the bit line contact plug, and perpendicular to the first word line multilayered structure and the second word line multilayered structure.

13. The semiconductor memory device according to claim 7, further comprising:
    a peripheral region arranged below the cell region.

14. The semiconductor memory device according to claim 13, further comprising:
    an active region arranged in the peripheral region;
    a gate electrode perpendicular to the active region; and
    a junction region formed in the active region at both sides of the gate electrode.

15. The semiconductor memory device according to claim 14, further comprising:
    a metal line coupled to the junction region,
    wherein the metal line is coupled to a second contact.

16. A semiconductor memory device comprising:
    a cell region in which a word line multilayered structure is formed;
    a peripheral region arranged below the cell region;
    a slimming region arranged in the cell region, suitable for coupling the cell region to the peripheral region, and including a pad structure formed by etching the word line multilayered structure of the cell region; and
    a plurality of bit lines formed over the word line multilayered structure and perpendicular to the word line multilayered structure,
    wherein the slimming region is disposed between the bit lines in the cell region.

17. The semiconductor memory device according to claim 16, further comprising:
    an active region arranged in the peripheral region;
    a gate electrode perpendicular to the active region;
    a junction region formed in the active region at both sides of the gate electrode;
    a bit line contact plug formed to pass through the word line multilayered structure; and
    a plurality of bit lines coupled to the bit line contact plug, and perpendicular to the word line multilayered structure.

* * * * *